United States Patent
Hirano et al.

(10) Patent No.: US 7,137,055 B2
(45) Date of Patent: Nov. 14, 2006

(54) SEMICONDUCTOR TESTING EQUIPMENT, TESTING METHOD FOR SEMICONDUCTOR, FABRICATION METHOD OF SEMICONDUCTOR, AND SEMICONDUCTOR MEMORY

(75) Inventors: Katsunori Hirano, Yokohama (JP); Shuji Kikuchi, Yokohama (JP); Yuji Sonoda, Hiratsuka (JP); Wen Li, Yokohama (JP); Tadanobu Toba, Yokohama (JP); Takashi Kanesaka, Kokubunji (JP); Masayuki Takahashi, Hachioji (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 207 days.

(21) Appl. No.: 11/012,355

(22) Filed: Dec. 16, 2004

(65) Prior Publication Data

US 2005/0149803 A1    Jul. 7, 2005

(51) Int. Cl.
*G06F 11/00*    (2006.01)
(52) U.S. Cl. ..................... 714/738; 714/718
(58) Field of Classification Search ............... 714/718, 714/738; 324/765; 365/200, 225.7; 716/1
See application file for complete search history.

(56) References Cited

U.S. PATENT DOCUMENTS 6,094,733 A  *  7/2000  Momohara ............... 714/718
6,097,206 A  *  8/2000  Takano ...................... 324/765
6,324,106 B1 * 11/2001  Urakawa .................... 365/200
6,430,101 B1 *  8/2002  Toda ....................... 365/225.7
6,601,218 B1 *  7/2003  Sato et al. ................... 716/1

FOREIGN PATENT DOCUMENTS

| JP | 2002-170397 | 6/2002 |
| JP | 2002-288996 | 10/2002 |
| JP | 2003-132697 | 5/2003 |
| JP | 2003-307545 | 10/2003 |
| JP | 2003-344489 | 12/2003 |
| JP | 2004-020503 | 1/2004 |
| WO | 01/56038 | 8/2001 |

\* cited by examiner

*Primary Examiner*—David Ton
(74) *Attorney, Agent, or Firm*—Mattingly, Stanger, Malur & Brundidge, P.C.

(57) ABSTRACT

Semiconductor testing equipment according to the present invention comprises: an algorithmic pattern generator for generating a test pattern for testing a memory under test and applying the pattern to the memory under test; a comparator for comparing a response signal from the memory under test and an expected value from tho algorithmic pattern generator; a fail address acquisition part for storing an address of the memory under test (fail address) when a result compared by the comparator is failed; a fail address analysis part for analyzing the failed address and calculating the address to be repaired (repair address); and a cycle-pattern generator for redundancy processing for inserting the address to be repaired into a test pattern and applying the address to the memory under test, so that even when capacity of the semiconductor memory is increased, a fabrication yield thereof is raised by testing the memory after the packaging and by performing the redundancy processing of a defective.

15 Claims, 11 Drawing Sheets

*Fig.9*

Monitor

| Pattern | Test Memory | Test Result |
|---|---|---|
| Pattern 1 | DUT1 | Pass |
| | DUT2 | Fail |
| | DUT3 | Pass |
| | ⋮ | ⋮ |
| | DUTn | Pass |
| Pattern 2 | DUT1 | Fail |
| | DUT2 | Fail |
| | DUT3 | Pass |
| | ⋮ | ⋮ |
| | DUTn | Pass |
| ⋮ | | |
| Pattern n | DUT1 | Fail |
| | DUT2 | Fail |
| | DUT3 | Pass |
| | ⋮ | ⋮ |
| | DUTn | Pass |

| | Test Memory | Test Result | Determination of Advisability of Repair |
|---|---|---|---|
| TOTAL | DUT1 | Fail | Repairable |
| | DUT2 | Fail | Unrepairable |
| | DUT3 | Pass | — |
| | ⋮ | ⋮ | ⋮ |
| | DUTn | Pass | — |

SEMICONDUCTOR TESTING EQUIPMENT, TESTING METHOD FOR SEMICONDUCTOR, FABRICATION METHOD OF SEMICONDUCTOR, AND SEMICONDUCTOR MEMORY

CROSS-REFERENCE TO RELATED APPLICATION

The present application claims priority from Japanese patent application No. JP 2003-419056 filed on Dec. 17. 2003, the content of which is hereby incorporated by reference into this application.

BACKGROUND OF THE INVENTION

The present invention relates to a fabrication technique for a semiconductor memory and, in particular, to technique effectively applied to a semiconductor memory, semiconductor testing equipment therefor, a testing method thereof, and a fabrication method thereof.

In recent years, advancement is made of a speed-up and a high-capacity memory represented by a DRAM. In the high-speed memory, a SDRAM (Synchronous DRAM) that executes a read/write operation to the memory in synchronization with a clock has become a mainstream. Quite recently, there to a SDRAM with a DDR (Double Data Rate), in which data is outputted in synchronization with both of a rising edge and a falling edge of the clock. For this reason, a data transmission rate thereof is doubled without increasing a clock frequency, whereby an operation having a further higher rate than a current rate of 266 to 333 Mbps has become possible.

Furthermore, in the high-capacity memory, by the DRAM characterized in that only a single transistor is used in a memory cell, the high-capacity memory having several gigabits through 512 Mbits from 256 Mbits becomes a mainstream increasingly. Further, an important factor other than the factors of the high speed and capacity of the memory is to make a price of the memory lower. A market competition of the memory is in a dead heat state, and respective companies give special emphases on making the price of the memory lower. In a semiconductor testing equipment for testing such memories, it is desired to reduce a cost of testing together With fulfillment of needs of the high speed and capacity of the memory. It is indispensable to make lower the price of the semiconductor testing equipment for testing the memory in order to reduce the cost of testing. It is effective to increase integration of LSIs constituting the memory testing equipment and downsize the apparatus in order to make the cost of testing lower.

Furthermore, in fabrication of the memory, even if there is a defect in one memory cell constituting the memory, the entirety of a memory chip is regarded as a defective one. However, since a ratio at which the defect is found in one memory chip increases due to the high capacity of the memory, a fabrication yield is decreased due to the high capacity thereof and making the price of the memory lower becomes difficult. Consequently, preliminary memory cells (redundant cells) are normally found in the same memory chip in advance in addition to the memory cells which are originally used at the time of fabricating the memory. In the case where any defective memory cells are found, a decrease in the yield in the fabrication is prevented by executing a redundancy processing for replacing the defective memory cells with the preliminary memory cells.

Such a redundancy processing is generally performed by detecting a defective cell address by a probe inspection in a wafer level of a semiconductor and replacing the defective cell with a redundant cell. For example, Japanese Patent Laid-open No. 2003-132697 discloses a technique in which, in the testing of the memory such as a DRAM, data of "1" or "0" is written into an arbitrary address of the memory and the data is read from the address to be compared to the written data (expected value) and then determines whether the memory is normal. At this time, if the data written into the memory and the data read from the memory are inconsistent with each other in at least one item obtained from a comparison result, it is judged that the whole memory is a defective. However, it is required to memorize information of the memory cell (FBM: Fail Bit Map) which has been defect (failed) in order to perform the redundancy processing. This FBM information is stored in the fail memory as a result of testing of a memory under test.

SUMMARY OF THE INVENTION

By the way, as described above, the redundancy processing is generally performed by detecting a defective cell address through a probe inspection in a wafer level of a semiconductor and replacing the defective cell with the redundant cell. However, since a ratio of defection generated in one memory chip increases along with an increase in the capacity of the memory to be a test object, a fabrication yield of the memory is decreased due to an increase in the capacity thereof.

Furthermore, the address information of the memory cell increases along with the increase in the capacity of the memory to be a test object. Therefore, as described in, Japanese Patent Laid-open No. 2003-132697, if the FBM information is stored in the fail memory, the fail memory of the semiconductor testing equipment such as a memory tester must be also increased in capacity depending on the memory under test (e.g., when the memory under test is 512 Mbits, the fail memory is also 512 Mbits). For this reason, the price of the fail memory is increased and the price of the semiconductor testing equipment is also increased accordingly.

Furthermore, in testing the semiconductor memory, normally, a number of memories are simultaneously tested (e.g., 64 memories per one testing equipment) in order to reduce the costs for test (test cost) and the time for test (test time). Therefore, since the above-mentioned fail memory is required to be increased in capacity similarly to the simultaneous test, the price of the equipment further is increased.

Also, since the information stored in the fail memory is a result (pass/fail information) of the test of the memories, all the information items are read from the fail memory in order to fetch a fail address. Then, it is required to calculate unfavorable addresses (fail addresses) by a computer in accordance with the read data values (e.g., "fail" in the case of "1" and "pass" in the case or "0"). Depending on the increase in the capacity of the fail memory, a processing time for calculating the fail address also increases.

From the above-mentioned description, there are three problems in the redundancy processing for replacing the defective addresses with the redundant cells on the basis of the probe inspection in the wafer level of the semiconductors: firstly, a yield in the fabrication of the memories is decreased because of the increase in the capacity of the semiconductor memory; secondly, the price of the semiconductor testing equipment is increased; and thirdly, the processing time is increased.

Therefore, in order to solve the first problem, an object of the present invention is to provide a semiconductor fabrication technique, which is capable of preventing oven the fabrication yield of the high-capacity memory even from being decreased by devising a positioning of the redundancy processing step in a fabrication process of the semiconductor memory.

Furthermore, in order to solve the second and third problems, another object of the present invention is to provide a semiconductor fabricating technique, which is capable of realizing the low price of the semiconductor testing equipment and the shortening of the processing time and further the lower price of the semiconductor memory, even in the high-capacity memory by devising a circuit structure until a repair pattern is generated by acquiring a fail address.

The above and other objects and novel features of the present invention will become apparent from the description of the specification and the accompanied drawings.

Outlines of representative ones of inventions disclosed in the present application will be briefly described as follows.

That is, the present invention achieves semiconductor testing equipment comprising: an algorithmic pattern generator for generating a test pattern for testing a memory under test and applying the pattern to the memory under test; a comparator for comparing a response signal from the memory under test and an expected value from the algorithmic pattern generator; a fail address acquisition part for storing an address of a fail memory when a result compared by the comparator is failed; a fail address analysis Dart for analyzing the failed address and calculating the address to be repaired; and a cycle-pattern generator for redundancy processing for inserting the address to be repaired into a test pattern and applying the address to the memory under test, wherein testing of the memory under test and a redundancy processing of the memory under test are executed.

Therefore, according to the present invention, it is possible to prevent a decrease in the fabrication yield of the high-capacity memory by performing a redundancy processing after the packaging.

Effects obtained from representative ones of inventions disclosed in the present application will be briefly described as follows.

That is, according to the present invention, by performing the redundancy processing after the packaging, the fabrication yield in the high-capacity memory can be from be decreased.

Furthermore, according to the present invention, the screening inspection and the redundancy processing are performed by the same semiconductor testing equipment, so that the memory capacity for the fail address can be decreased by the result that the reducing of the price of the semiconductor testing equipment and the shortening of the processing time thereof can be realized and, in the end, the low price of the semiconductor memory can be realized.

BRIEF DESCRIPTION OF THE DRAWINGS

FIG. 9 is an explanatory view for showing a screen at the time when the test of the memory under test and the redundancy processing are executed by the semiconductor testing equipment according to a first embodiment of the present invention.

DESCRIPTION OF THE PREFERRED EMBODIMENTS

Figure 1:
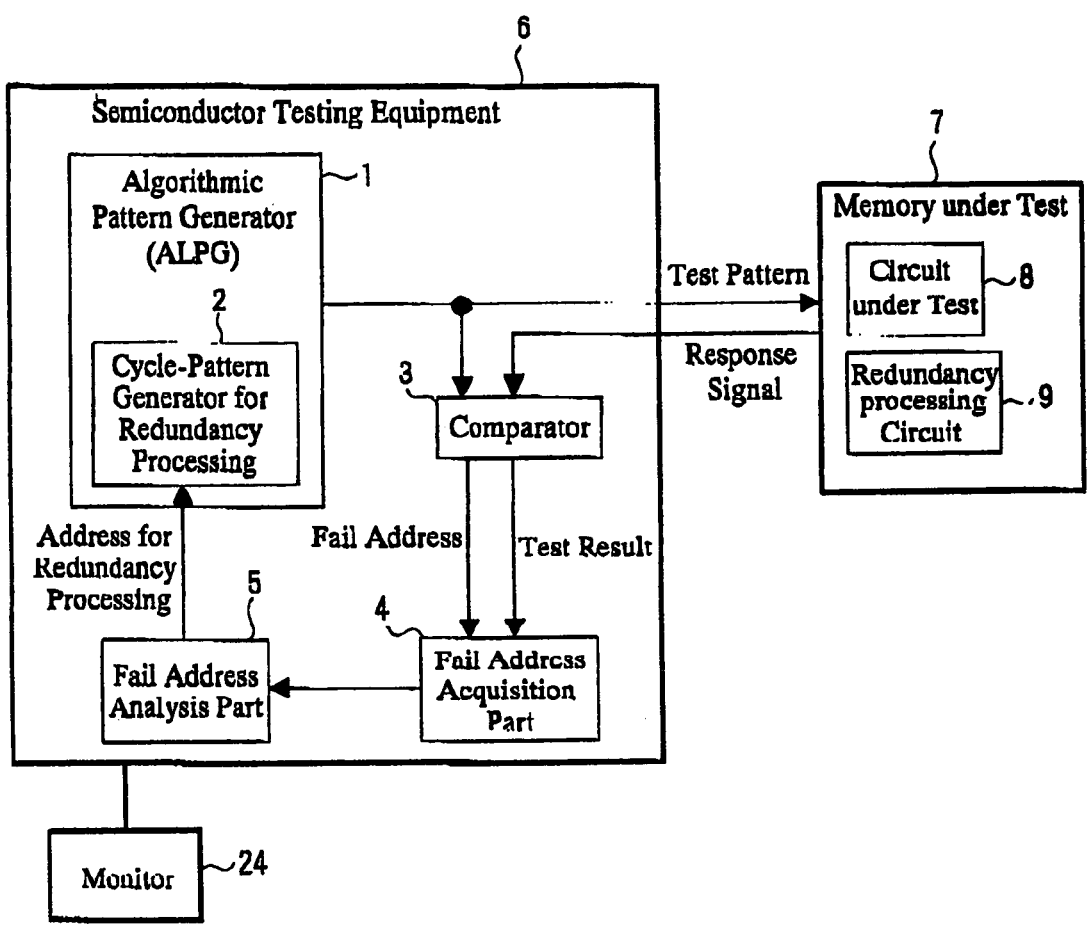
FIG. 1 is a block diagram showing one piece of semiconductor touting equipment according to a first embodiment of the present invention.

Hereinafter, embodiments of the present invention will be detailed based an the drawings. Note that, throughout all the drawings for explaining the embodiments, the members having the same function are denoted in principle by the same reference numeral and the repetitive description thereof will be omitted.

(First Embodiment)

In the beginning, by using FIG. 1, one example of a structure of one piece of semiconductor testing equipment according to a first Embodiment of the present invention will be described.

The semiconductor testing equipment 6 according to this embodiment of the present invention comprises: an algorithmic pattern generator 1 (ALPG: Algorithmic Pattern Generator), which generates a test pattern for testing a memory under test 7 and applies the pattern to the memory under test 7; a comparator 3 for making comparison of a response signal from the memory under test 7 and an expected value obtained from the algorithmic pattern generator 1; a fail address acquisition part 4 for storing a fail address in accordance with test results obtained from the comparator 3; a fail address analysis part for calculating an address to be repaired by analyzing the fail address stored in the fail address acquisition part 4, and a cycle-pattern generator for redundancy processing 2 for inserting an address for redundancy processing outputted from the fail address analysis part 5 into a cycle for redundancy processing to apply the address to the memory under test 7. The repair cycle generator for redundancy processing 2 in included in the algorithmic pattern generator 1.

To this semiconductor testing equipment 5, a monitor 24 is electrically connected for displaying the toot result of advisability of repair of the memory under test 7. Furthermore, the memory under test 7 in this semiconductor testing equipment 6 is also electrically connected to the semiconductor testing equipment 6. In this memory under test 7, a circuit under test a and a redundancy processing circuit 9 are incorporated. The circuit under teat 8 is a memory circuit comprising a plurality of memory cells to be teat objects, and the redundancy processing circuit 9 has a function of storing a repared address value and a function of replacing defective cells with redundant cells in the case where a address to be repaired is inputted.

In the case where the memory under test 7 constituted in this manner is tested by the semiconductor testing equipment 6, a regular address depending on order of the testing, test data to be written in the memory, and a control signal for performing a writing/reading operation to the memory under test 7 are applied from the algorithmic pattern generator 1 to the memory under teat 7.

In the beginning, data of "1" or "0" is applied to one arbitrary address together with the writing control signal (write command). Next, when a reading control signal (read command) is applied to one address which has been written, data is outputted from the memory under test 7. Consequently, this data is read out and is compared to the data which is written in advance, whereby it is determined whether the two data items coincide with each other (pass) or not (fail). The judgment is made with respect to all the addresses of the memory under test 7, whereby it is determined whether the data on the memory is nondefective or defective (pass/fail determination). If at least one inconsistent (fail) address is detected, the memory under test 7 is normally judged to be a defective. However, if the redundancy processing is performed for preventing the yield thereof from being decreased, the fail address value is memorized in the rail address acquisition part 4.

As described in the column "background of the invention", the conventional semiconductor testing equipment has a high-capacity fail memory for memorizing the fail addresses, so that the yield is decreased with an increase in the capacity of the memory under test and both the equipment price and the processing time of the fail address analysis are increased. This is because all the fail addresses are memorized for analyzing the test result in the case of the conventional semiconductor testing equipment.

In contrast, in the semiconductor testing equipment 6 according to the present embodiment, a value of the address failed in the fail address memory of the fail address acquisition part 4 is memorized. The capacity of the fail address memory may be smaller than that of the memory under test 7. This is because: the number of redundant cells mounted for performing the redundancy processing is limited due to a physical arrangement condition of the memory chip the number of redundant calls is indeed very few in comparison with the capacity of the memory; and it is not required to memorize all the fail addresses in the case of aiming at performing the redundant processing. In the cage of the DRAM memory, the location of the memory cells is determined by a bank address (B), a row address (X), and a column address (Y), and these address values are stored in the fail address acquisition part 4. At this time, the fail address value is stored in real time in the fail address acquisition part 4 only in the case where the fail judgment is made by the comparator 3.

Further, the fail address analysis part 5 makes determination of advisability of the repair by calculating the addresses which should be actually repaired and comparing the rail address and the information for redundant processing read from the memory under teat 7, on the basis of the fail address stored in the fail address acquisition part 4.

Then, the cycle-pattern generator for redundancy processing 2 generates a pattern for redundant processing, which is applied to the memory under test 7, from both of the test result of the advisability of repair outputted at the fail address analysis part 5 and the repair address. At this time, when the unrepairable item is outputted in the test result of the advisability of repair, the repair pattern is not generated. From the above description, it is possible to perform the redundancy processing together with the testing of the memory under test 7.

Figure 2:
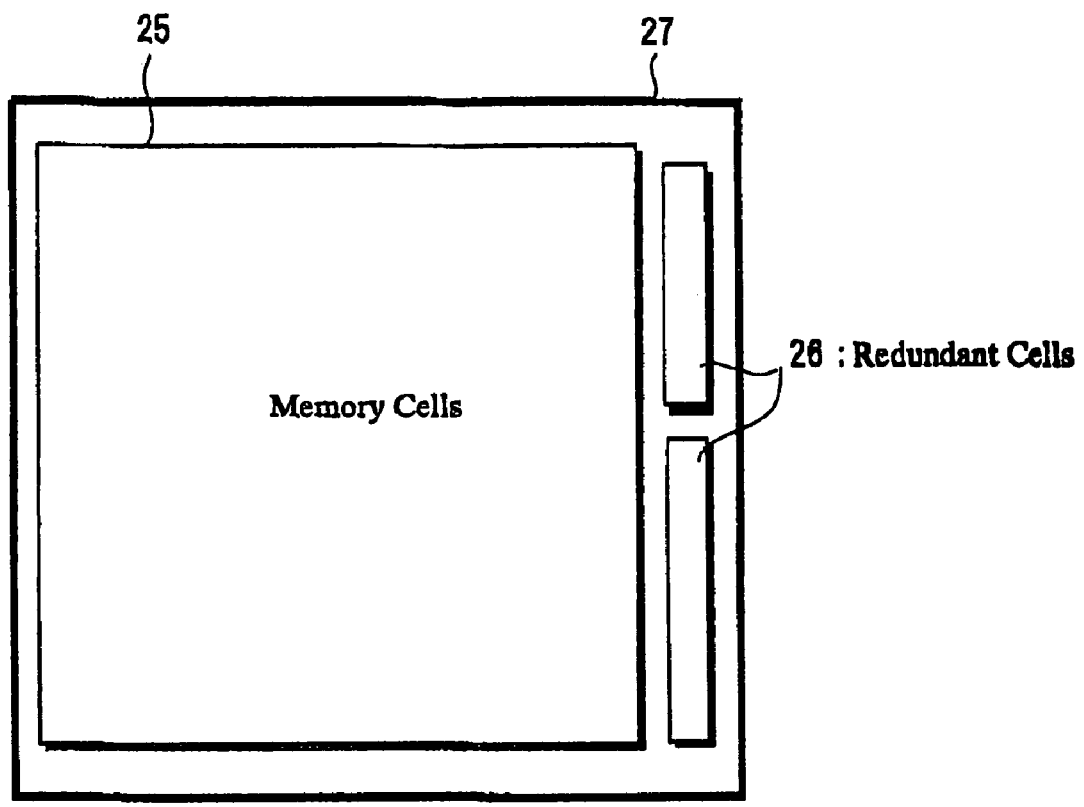
FIG. 2 is a block diagram showing a memory area in a memory under test in the semiconductor testing equipment according to a first embodiment of the present invention.

Next, by using FIG. 2, in the semiconductor testing equipment according to the prevent embodiment, one structure example of a memory area in the memory under test will be described. FIG. 2 is a view showing a structure of a memory area in a memory under test.

As described above, in design of the memory area of the memory under test 7, it is not required to memorize all the fail addresses in the case of aiming at executing the redundancy processing. For this reason, as shown in FIG. 2, since the fail memory cell 25 is replaced with the redundant cell 26 only in the case where the memory cell 25 is failed, the redundant call 26 is shipped without being used in the case where the memory cell is not failed. Therefore, since the price of the memory is raised at a time of preparing a number of redundant cells 26, a small number of redundant cells 26 are normally mounted. For example, a redundant call having a capacity of approximately 32 bits is mounted on a memory cell with a capacity of 512 Mbits, whereas a redundant cell with a capacity of 64 bits is mounted on a memory cell with a capacity of approximately 1 Gbits.

Figure 3:
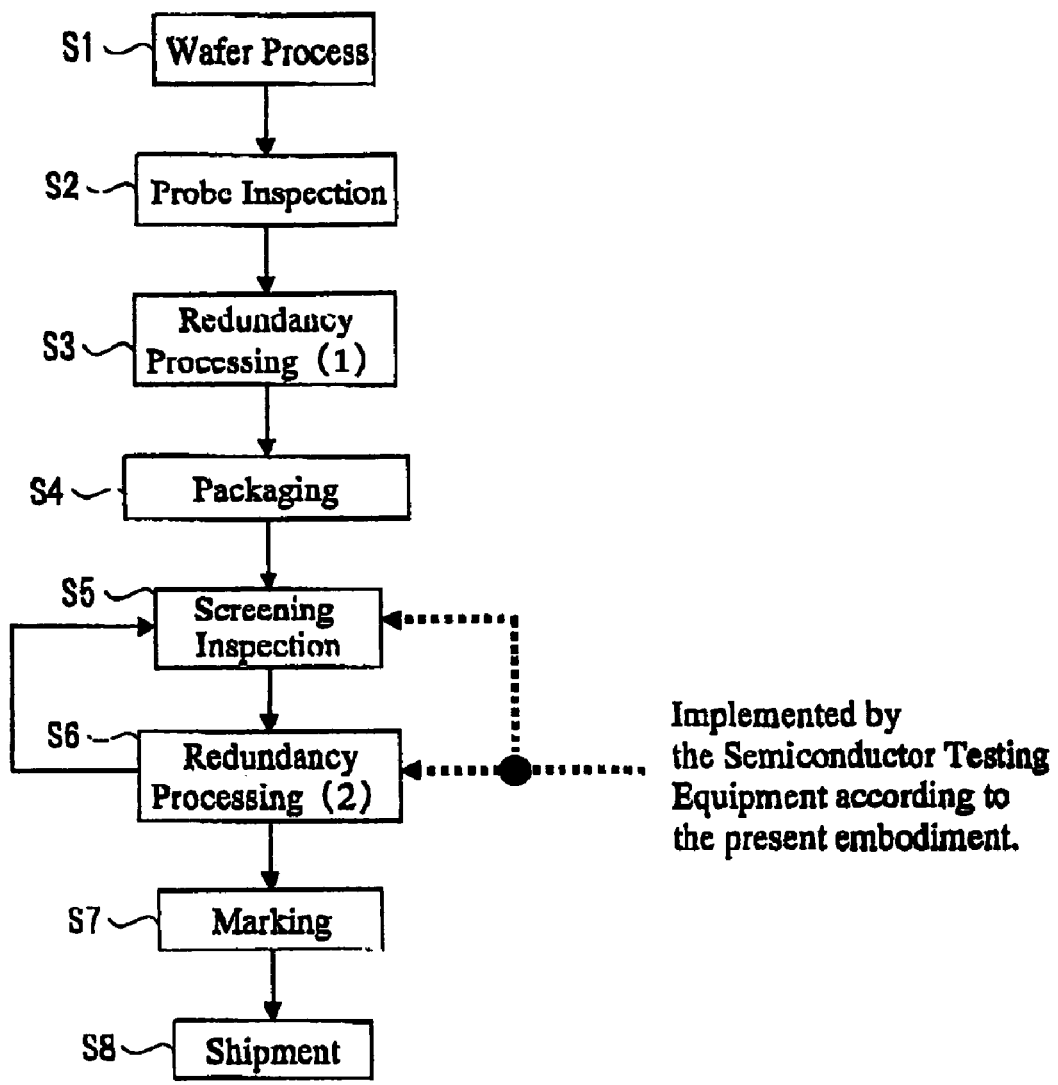
FIG. 3 is a flowchart showing a memory test to which the semiconductor testing equipment according to a first embodiment 1 of the present invention is applied.

Next, by using FIG. 3, one flowchart example of a memory test, in which the semiconductor testing equipment according to the present embodiment is applied, will be described. FIG. 3 shows a flowchart of the memory test.

In a process of the memory test, after a wafer process is completed (S1), a probe inspection is made in a wafer level (S2). At this time, if any defective memory cell is defected (failed), the redundancy processing (1) is executed to the defective memory cell (S3). Then, the memory cells are packaged (S4), and a screening inspection for testing the semiconductor in the packaged state is made (S5). The redundancy processing (2) is performed to the memory cell failed in the screening inspection after the packaging (S6). Then, the screening inspection is made again. Thereafter, a nondefective memory is marked (S7) and shipped as a product (S8).

Note that, at the wafer process in the semiconductor fabrication of the S1, the circuit element is formed on or incorporate into the semiconductor wafer. Then, a wiring is formed for electrically connecting an electrode of the circuit element and an external connection terminal on the semiconductor wafer. After the semiconductor wafer is diced via each step of forming a protective film on the semiconductor wafer, the probe inspection of the S2 for testing the semiconductor in the wafer level of the semiconductor is performed.

In the case where the memory capacity is small at the step of this memory test, the number of memories failed in the screening inspection after the packaging is small, and even when the failed memory is discarded an a defective one, the yield thereof is not affected. However, when the capacity of the memory is increased, such a ratio that the defect is generated in one memory chip becomes high as described in the column "background of the invention", so that due to the increase in the capacity of the memory, the fabrication yield of the memory is decreased and it becomes difficult to achieve the low price of the memory.

For this reason, when the screening inspection and the redundancy processing of the memory after packing the memory are executed by the semiconductor testing equipment 6 as used in the present embodiment, the decrease in the yield can be prevented. Further, the low price of the memory can be realized by executing the screening inspection and the redundancy processing after the packaging thereof. Furthermore, by performing both of the screening inspection and the redundancy processing after the packaging in the semiconductor testing equipment 6 according to the present embodiment, a process from the screening inspection to the redundancy processing and the follow-up screening inspection after the repair become executable in the same equipment. Therefore, work of detaching the memory under test 7 can be omitted and the low price of the memory becomes possible.

Figure 4:
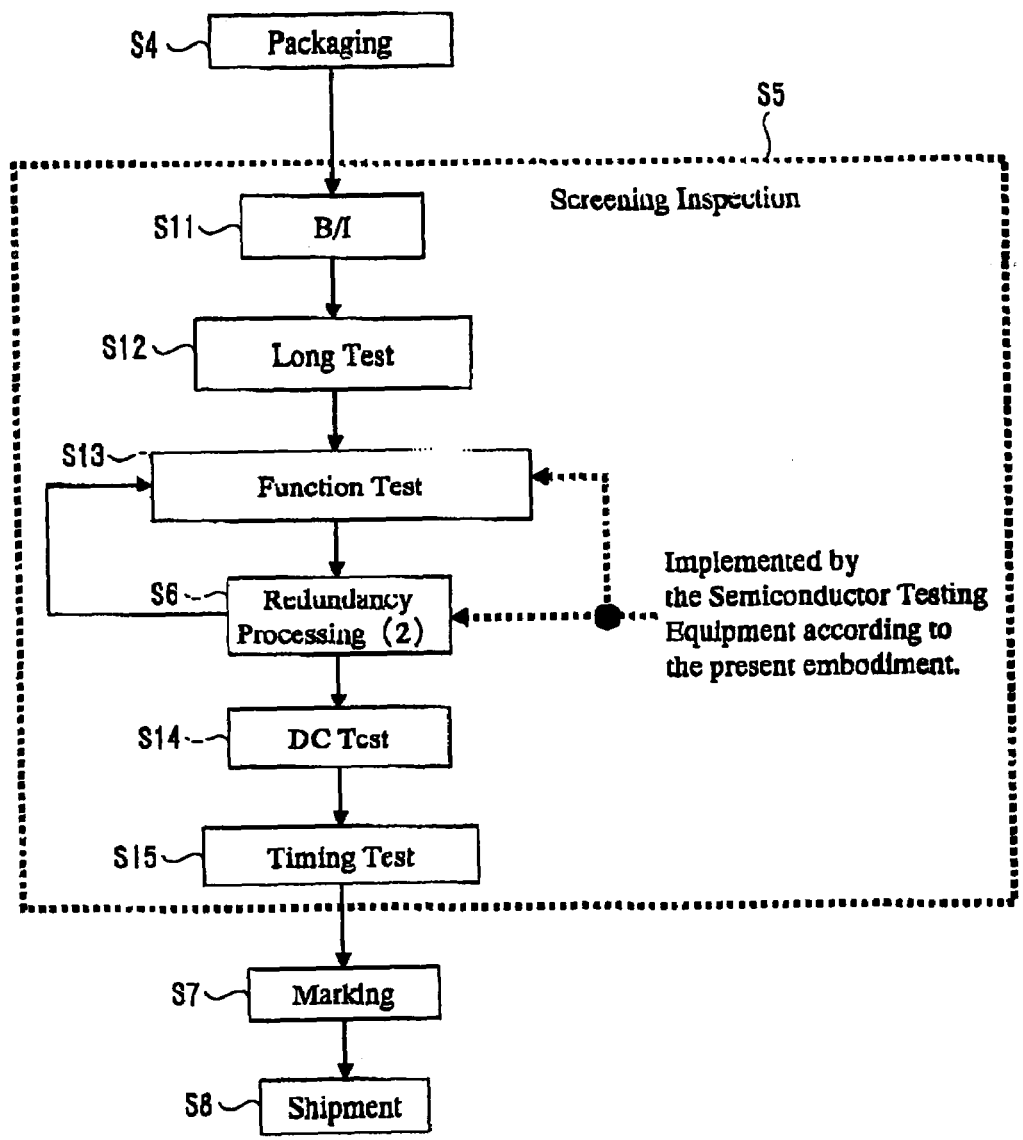
FIG. 4 is a flowchart showing a detailed screening inspection by the semiconductor testing equipment according to a first embodiment of the present invention.

Next, by using FIG. 4, one flowchart example of a detailed screening inspection by the semiconductor testing equipment according to the present embodiment will be described. FIG. 4 shows a flowchart of a detailed screening inspection.

The screening inspection (S5) primarily is composed of a burn-in test (B/I) (S11), a long test (S12), a function test (S13), a DC test (S14), and a timing test (S15). The semiconductor testing equipment 6 according to the present embodiment is applied to the function test at the S13 and the redundancy processing (S6) after that process. The function test is to test the function at the time of operating the memory under test 7 at an actual speed. In the DC test and the timing test thereafter, it is desired that the redundancy processing is performed based on a result of the function test in order to test grades of the memory.

Figure 5:
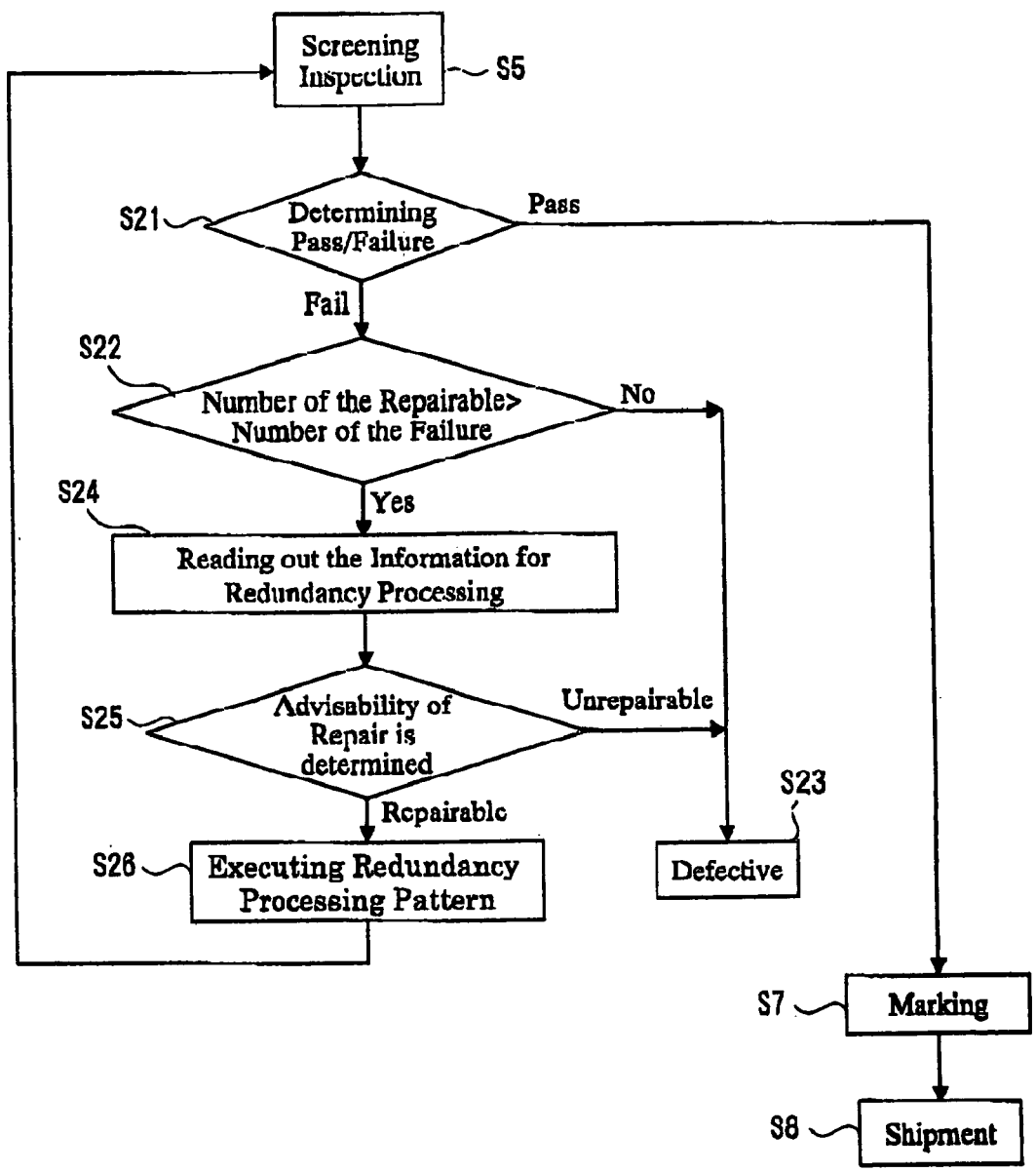
FIG. 5 is a flowchart showing a detailed screening inspection and a redundancy processing by the semiconductor testing equipment according to a first embodiment of the present invention.

Next, by using FIG. 5, one flowchart example of the detailed screening inspection and the redundancy processing by the semiconductor testing equipment according to the present embodiment will be described. FIG. 5 shows a flowchart of the detailed screening inspection and the redundancy processing.

By the screening inspection (memory test) (S5), the pass/fail result of testing the memory is determined (S21). If being passed, the memory is marked (S7) and shipped (S8).

If the memory is failed, judgment is made of whether the number of failed memory cells is smaller than that of repairable memories (the number of repairable memories is different per memory's product) (S22). Here, if the number of failed memory calls is larger than that of repairable memories (if "No"), this memory is determined as an unrepairable one and is discarded as a defective. If the number of failed memory cells is smaller than that of repairable memories (if "Yes"), the pattern of reading out the information for redundancy from the memory under test 71 is executed (S24). As a result, the information for redundancy is read from the memory under test 7.

The information for redundancy is information obtained from the redundant processing having been performed to the memory call, which is failed as a result of the probe inspection to which the memory under test 7 is subjected in the wafer level. The number of memories having been repaired and the addresses having been repaired are stored in the redundancy processing circuit 9 of the memory under test 7. As described above, the number of redundant calls, to which the redundancy processing is performed, is extremely smaller than the capacity of the memory, and the redundant cells having been once repaired in the wafer level cannot be used and further the redundant processing cannot be performed to the addresses heaving been once repaired (addresses having been replaced with the redundant cells).

Consequently, in the case of the memory having been failed by the testing after the packaging, such a memory cannot be a nondefective after the redundancy processing is performed it the number of repairable memory cells runs short and/or if the addresses having been already repaired is failed again. For this reason, determination of the advisability of repair (S25) is required to perform the redundant processing thereof. As a result of the determination of the advisability of repair, it is determined that the repair is impossible in the following cases: (1) the repairable number runs short: and (2) the fail address is the same as the repaired address in number. After such determination, the memory, failed by the testing after the packaging is regarded as a defective and is discarded (S23).

Further, as a result of the determination of the advisability of repair (S25), the repairable memory is repaired by performing a repair pattern (S26). Then, the screening inspection is performed again (S25). That is, the case where it is judged that the memory is repairable is the cases where (1) the number of the fail addresses (the number of files) is smaller than that of repairable memories: and (2) the fail address is not the same as the repaired addresses.

Here, a function of the memory under test 7 about the read and repair of the information for redundancy processing will be described. In the beginning, a pattern for entering from the outside or the memory under test 7 to a test mode is applied in order to read out the information for redundancy processing. When the memory entry pattern is applied to the memory under test 7, the redundancy processing circuit 9 is activated to be switched over to the test mode. Next, when a command for reading the information for redundancy processing is applied thereto, the information for redundancy processing is outputted from the memory under test 7. Such information is taken in the semiconductor testing equipment 6 according to the present embodiment as described above and is subjected to a process for the determination of the advisability of repair.

In the redundancy processing, firstly, a pattern for entering from the outside of the memory under test 7 to the test mode is applied similarly to the case of reading out the information for redundancy processing. In the memory under test 7, when the test entry pattern is applied, the redundancy processing circuit 9 is activated to be switched over to the test mode. Next, when the address subjected to the redundancy processing is applied together with the command to perform the redundancy processing, the defective cells are replaced with the redundant cells by the redundancy processing circuit 9 incorporated in the memory under test 7 and are repaired.

Through the above-mentioned processing, the screening inspection and the redundancy processing become possible by the semiconductor testing equipment 6 according to the present embodiment.

Figure 6:
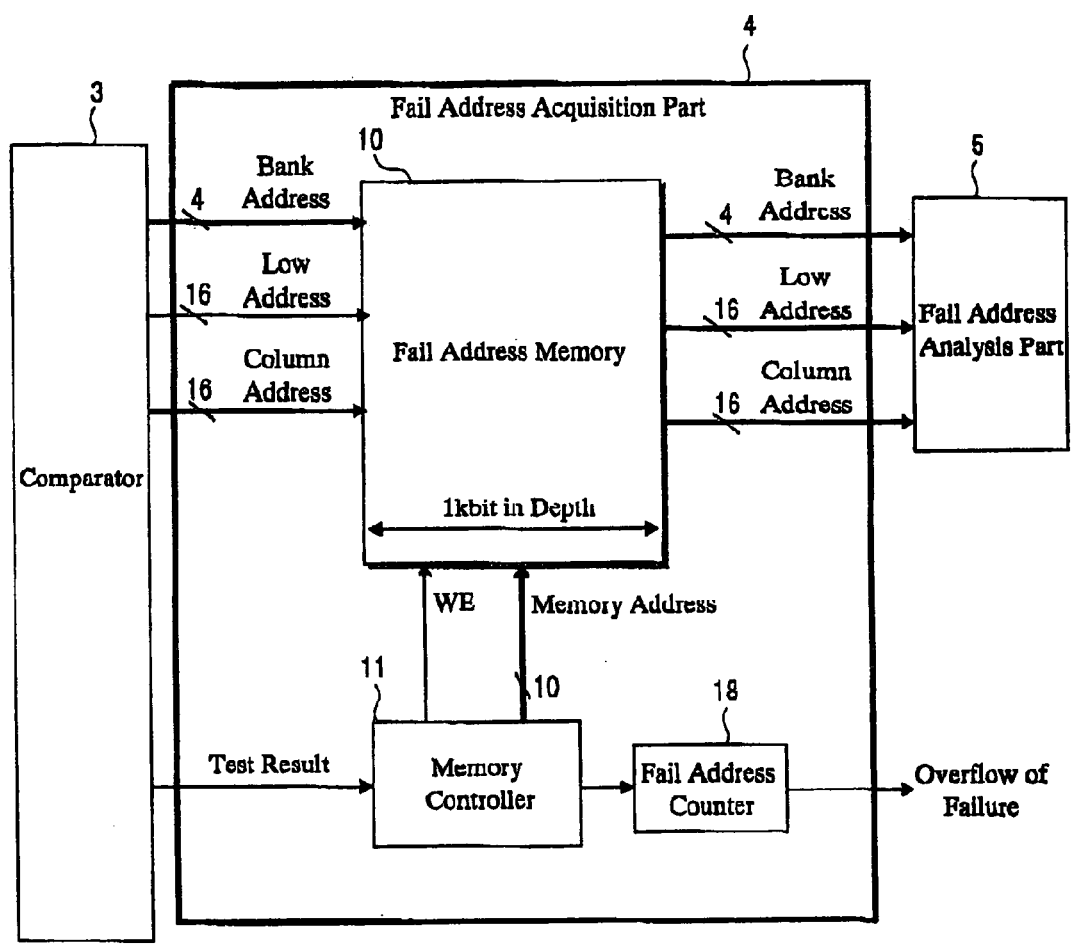
FIG. 6 is a block diagram showing a fail address acquisition part which is applied to the semiconductor testing equipment according to a first embodiment of the present invention.

Next, by using FIG. 6, one structural example of a fail address acquisition part applied to the semiconductor testing equipment according to the present embodiment will be described. FIG. 6 shows a structure of a fail address acquisition part.

The fail address acquisition part 4 comprises a fail address memory 10, a memory controller 11, and a fail address counter 18. In this fail address acquisition part 4, a test result obtained from the comparator 3 and a fail address are inputted. Only when the test result indicates "fail", the fail address acquisition part 4 has a function of storing the fail address in the fail address memory 10.

Only when the test result indicates "fail", the memory controller 11 outputs both of a signal (write-enable signal; WE), in which the fail address is allowed to be stored in the fail address memory 10, and a memory address of the fail address memory 10, thereby controlling the fail address memory 10.

The fail address counter 18 counts up every time the test result indicates "fail", and counts the number of fail addresses. At this time, if the number of fail addresses exceeds a depth of the fail address memory 10, it is judged that the number of fails is large and a count-over flow signal (OFF signal) is outputted, whereby it is determined that the memory is unrepairable.

The fail address memory 10 may have a small capacity as compared with the capacity of the memory under test 7, as described above. For example, in the case where the depth is set to 1024 under the condition that a bank address (BA) is a width of 4 bits, a row (X) address is a width of 16 bits, and a column (Y) address is a width of 16 bits, a value of "36 bits×1024=36864 bits" (approximately 37 kbits) is obtained and consequently shows that the capacity of the memory can be made extremely smaller than the case where the memory under test 7 is set to 512 Mbits.

Here, in the case where a structure of the fail address acquisition part 4 as shown in FIG. 6 is adopted, it is possible to store in real time the fail address. However, the value of the fail address is stored every time the memory under test 7 is accessed (every time the write/read operation is performed). Consequently, the same address is stored in an overlapped manner. This is because accessing and testing the same address a plurality of times are a normal operation in the testing of the memory. In particular in a DRAM, the same memory cell is frequently accessed in order to test an influence given by the adjacent memory cells (inter-bit interference). The overlapped addresses, which are stored in the fail address memories 10, are compressed by the fail address analysis part 5 so as to eliminate the same address, for example, per test pattern. This compression processing may be performed by an on-board processor.

Figure 7:
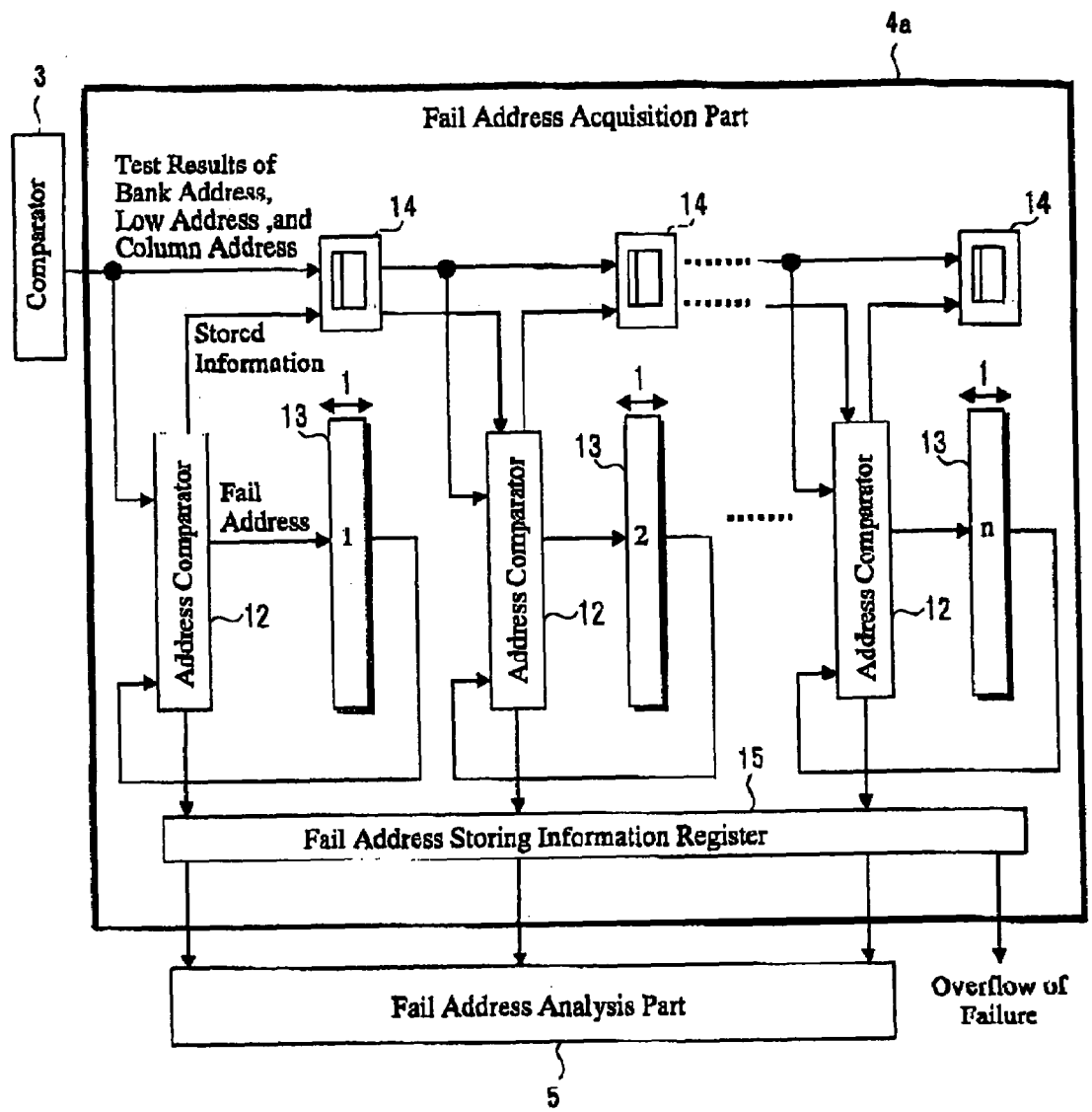
FIG. 7 is a block diagram showing another fail address acquisition part which is applied to the semiconductor testing equipment according to a first embodiment of the present invention.

Next, by using FIG. 7, another structure of a fail address acquisition part applied to the semiconductor testing equipment according to the present embodiment will be described. FIG. 7 shows another structure of a fail address acquisition part.

This fail address acquisition part 4a comprises an address comparator 12, a fail address memory 13, a flip-flop 14, and a fail address storing information register 15. This structure is such that the fail address is not stored so as to be overlapped in comparison with the structure or FIG. 6 as described above. The test result and the fail address from the comparator 3 are processed in the pipe line.

In the beginning, at a first stage, the fail address inputted to the address comparator 12 is compared with the address stored in the fail address memory 13. In the fail address memory 13, a fail address for one memory cell (for example, a capacity in which a bank address (BA) has a width of 4 bits, a row (X) address has a width of 16 bits, and a column (Y) address has a width of 16 bits and which a depth of 1 is provided) can be stored. As a result of comparison, when the test result indicates "fail" and the address is not stored in the fail address memory 13, the address is stored in the memory 13. In the case where the address in already stored in the memory 13, the stored address and the stored information are subjected to re-timing by the flip-flop 14 and sent to the next stage.

At the next stage, in the same manner, the fail address and the address stored in the fail address memory 13 are compared, and stored or sent to the next stage. If these processings are performed through, for example, 128 stages, it is possible to store 128 fail addresses which are not overlapped with each other. In the case where the 128 fail addresses are stored and a 129-th fail address is present, the fail address storing information register 15 judges that the umber of fails is many, outputs the count-over flow signal (OPT signal), thereby determining that the fail address is unrepairable. The sum of the capacity of the fail address memory 13 in this case becomes 36 bits×1×128 pieces=4608 bits (approximately 4.6 kbits), so that the memory with a smaller capacity than the capacity of the structure shown in FIG. 6 can be realized.

The fail address acquisition parts 4 and 4a shown in FIGS. 6 and 7 are each provided with a function of storing information for redundancy processing from the memory under test 7 in addition to the storing of the fail address. As described above, a pattern of the test mode is performed to the memory under test 7 to read the information for redundancy processing from the memory under test 7 and store it in the fail address acquisition parts 4 and 4a. At this time, in the case where the information for redundancy processing is stored, it is stored irrespective of the test result.

Figure 8:
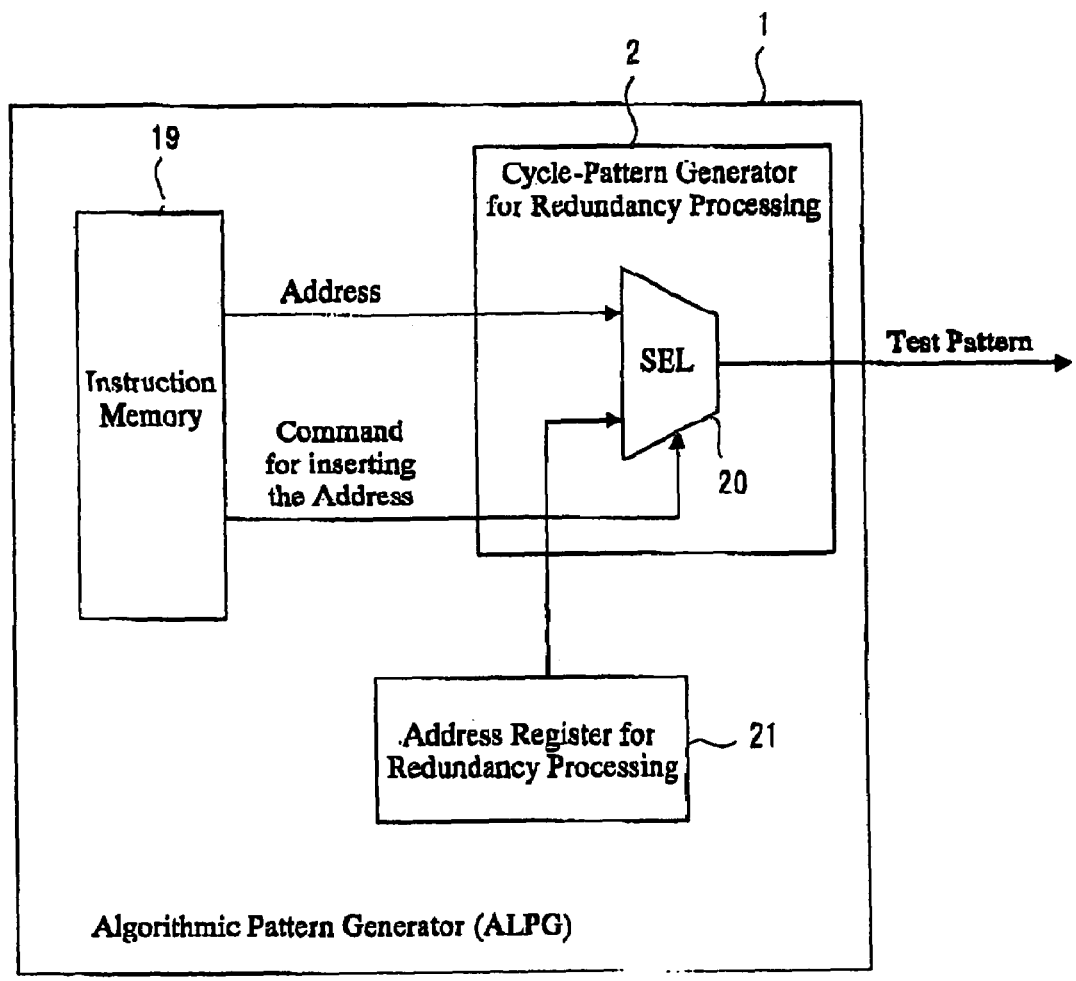
FIG. 8 is a block diagram showing an algorithmic pattern generator including a cycle-pattern generator for redundancy processing, which is applied to the semiconductor testing equipment according to a first embodiment of the present invention.

Next, by using FIG. 8, one structural example of an algorithmic pattern generator including a cycle-pattern generator for redundancy processing, which is applied to the semiconductor testing equipment according to the present embodiment, will be described. FIG. 8 shows a structure of an algorithmic pattern generator including a cycle-pattern generator for redundancy processing.

The algorithmic pattern generator 1 comprises a cycle-pattern generator for redundancy processing 2, an instruction memory 19, and an address for redundancy processing register 21. The cycle-pattern generator for redundancy processing 2 includes a selector 20.

The cycle-pattern generator for redundancy processing 2 has a function of changing over an address outputted in the case of performing a normal memory test and an address to be repaired. At the time of generating a normal test pattern, an address from the instruction memory 19 is outputted and, at the time of performing the repair pattern during the redundancy processing, the selector 20 is changed over in accordance with the address insertion command from the instruction memory 19, and an address which is stored in the address for redundancy processing register 21 and that is to be repaired is outputted. Here, in the address for redundancy processing register 21, the repair address judged to be repairable is stored by the fail address analysis part 5 as a test result of the advisability of the repair.

Next, by using FIG. 9, one example of a screen when a test of the memory under test and a redundancy processing is executed by the semiconductor testing equipment according to the present embodiment will be described. FIG. 9 shows a screen when the test of the memory under test and the redundancy processing are executed.

In the semiconductor testing equipment 6 according to the present embodiment, when it is judged that the memory under test 7, in addition to the test result obtained by testing the memory under test 7, is defect during the testing of the memory under test 7 and the performing of the redundancy processing. The monitor 24 displays the test result of whether the memory is repairable or unrepairable. For example, as shown in FIG. 9, the monitor 24 displays the repair test result of repairable, unrepairable, and the symbol "-" (pass) together with the test result on the pass or fail of the memories under test DUT1 to DUTn by respective patterns 1 to n of test signals, and the total test result of the memory under test. The memory, which is judged to be repairable, is subjected to the redundancy processing and is tested again and can be shipped as a nondefective.

From the foregoing description, according to the semiconductor testing equipment 6 according to the present embodiment, at least one of the following advantages of the present invention can be obtained.

(1) It is possible to prevent a decrease in the fabrication yield in the high-capacity memory by performing the redundancy processing after the packaging. As a result, the product price of the memory under test 7 can be decreased.

(2) The screening inspection and the redundancy processing are executable by the same semiconductor testing equipment 6 also in testing the high-capacity memory. As a result, the low price of the semiconductor testing equipment 6 and the shortening the processing time can be realized.

(3) Since the capacity of the memory for obtaining the fail address can be decreased, the downsizing and the low price of the semiconductor testing equipment 6 can be realized.

(4) The fail address can be obtained in real time, and the processing time for the redundancy processing can be shortened by reducing the capacity of the memory.

(5) By obtaining the information for redundancy processing from the memory under test 7 and making the determination of the advisability of repair, a wasteful processing can be eliminated to improve efficiency.

(6) Since the test price of the semiconductor testing equipment 6 can be reduced by making the price of the semiconductor testing equipment 6 low, the product price of the memory under test 7 can be decreased.

(Second Embodiment)

Figure 10:
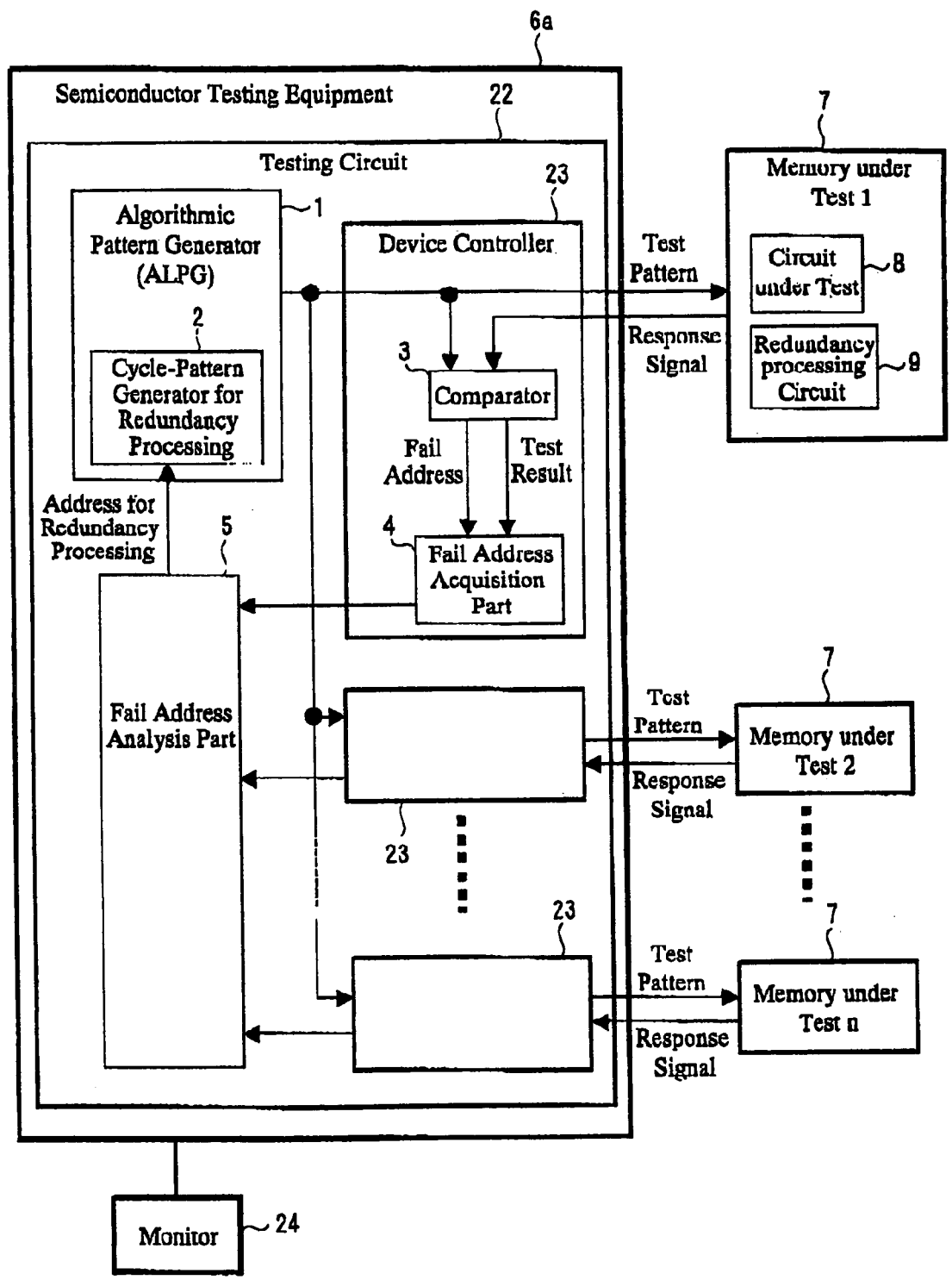
FIG. 10 is an explanatory view for showing one piece of semiconductor testing equipment according to a second embodiment of the present invention.

By using FIG. 10, one structural example of the semiconductor testing equipment according to a second embodiment of the present invention will be described. FIG. 10 shows a structure of the semiconductor testing equipment according to a second embodiment of the present invention.

The first embodiment has a structure for testing the memories under test 7 one by one, while one piece of semiconductor testing equipment 6a according to the present embodiment has a structure for testing a plurality of memories under test 7 concurrently.

That is, the semiconductor testing equipment 6a according to the second embodiment comprises one test circuit 22, This test circuit 22 comprises an algorithmic pattern generator 19 a fail address analysis part 5, and a plurality of device controllers 23, wherein the algorithmic pattern generator 1 includes a cycle-pattern generator for redundancy processing 2 and each of the device controllers 23 includes the comparator 3 and a fail address acquisition part 4. Further, the monitor 24 is connected to the semiconductor testing equipment 6a.

This semiconductor testing equipment 6a shares the algorithmic pattern generator 1 and the fail address analysis part 5. The number of device controllers 23 (1 to n) equal to that of memories under test 7 (1 to n) are mounted on the semiconductor testing equipment 6a. For example, in the case where sixty-four memories under test 7 are simultaneously tested, the sixty-four-circuit device controllers 23 are mounted.

In the structure of this semiconductor testing equipment 6a, a plurality of fail addresses for the memories under test 7 are acquired simultaneously (for example, the fail addresses for sixty-four memories under test are acquired at the sixty-four-circuit fail address acquisition part 4 at the same time). At the fail address analysis part 5, the fail address information items of sixty-four memories under test are analyzed in order of the memories under test 7. This analyzed fail address in outputted to the cycle-pattern generator for redundancy processing 2 as a repair address. In the cycle-pattern generator for redundancy processing 2, the repair pattern is applied to the memories under test 7 one after another in order.

At this time, since the address to be repaired is different per memory under test, the repair pattern is not outputted from the device controllers 23 corresponding to the memories under test 7 to which the pattern for redundancy processing is not applied. For example, in the case where a first redundancy processing or the memories under test 7 is executed, the pattern for redundancy processing is not applied to other memories under test 7 (2 to n).

From the aforementioned description, in the semiconductor testing equipment according to the present embodiment, the testing of the memories under test 7 and the plurality of redundancy processings can be executed at the same time in addition to the same advantages of the first embodiment.

(Third Embodiment)

Figure 11:
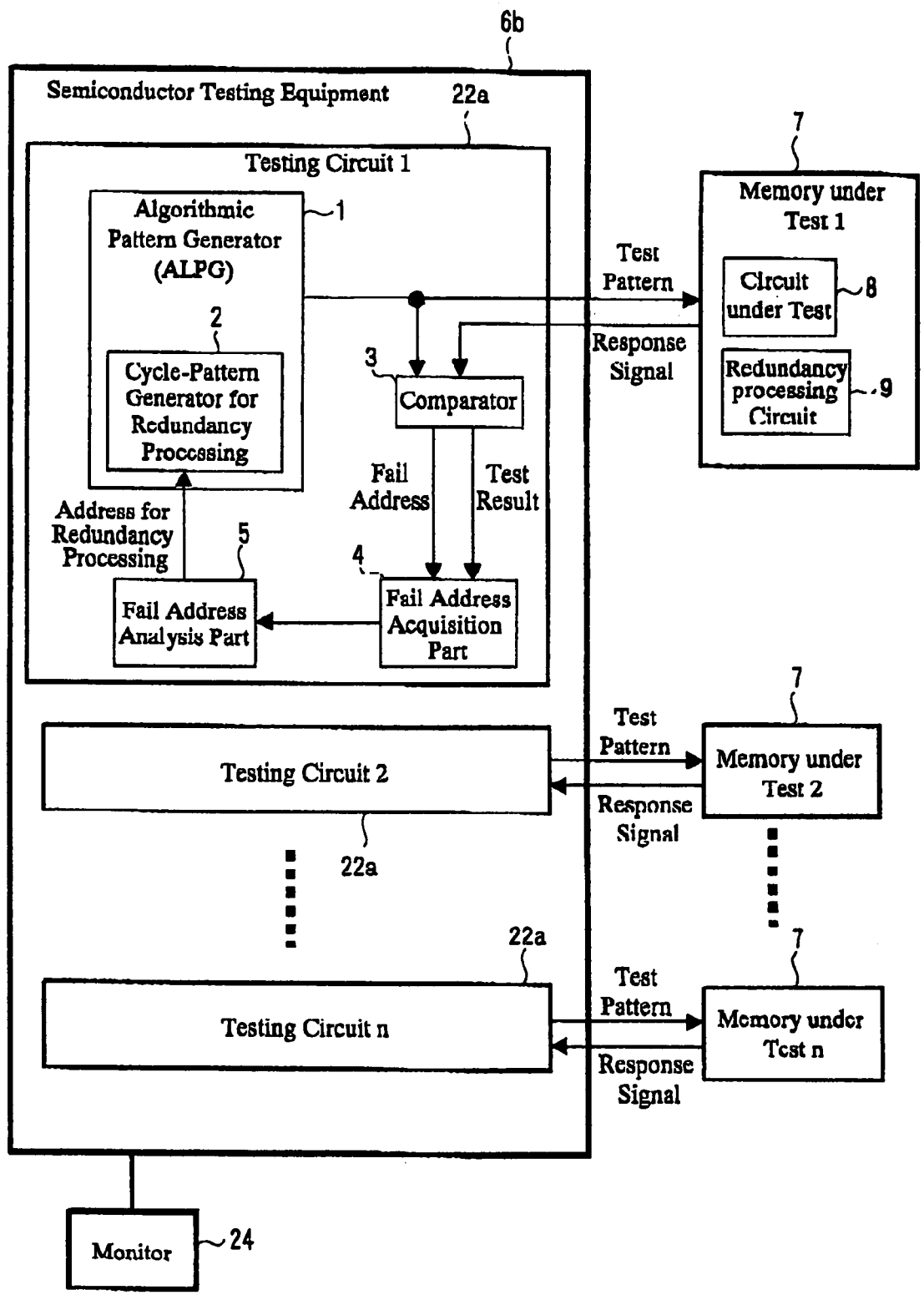
FIG. 11 is a structural view showing one piece of semiconductor testing equipment according to a third embodiment of the present invention.

By using FIG. 11, one structural example of one piece of semiconductor testing equipment according to a third embodiment of the present invention will be described. FIG. 11 shows a structure of the semiconductor testing equipment according to a third embodiment.

Similarly to the second embodiment, one piece of semiconductor testing equipment 6b according to the present embodiment includes a structure for testing a plurality of memories under test 7 simultaneously and further have a structure in which the test circuits 22a equal to the memories under test 7 in number are mounted.

That is, this semiconductor testing equipment 6b according to the present embodiment comprises a plurality of test circuits 22a, and each of the plurality of test circuits 22a comprises an algorithmic pattern generator 1 including a cycle-pattern generator for redundancy processing 2, a fail address analysis part 5, a comparator 3, and a fail address acquisition part 4.

A structure of the semiconductor testing equipment 6b is such that the analysis of the fail address at the fail address analysis part 5 and the generation of the pattern for redundancy processing at the cycle-pattern generator for redundancy processing 2 are performed at the same time in addition to acquiring at the same time a plurality of fail addresses of the memories under test 7.

From the foregoing description, in the semiconductor testing equipment 6b according to the present embodiment, by performing concurrently the analysis of the fail address and the generation of the pattern for redundancy processing in addition to the same effects as those obtained by the first and second embodiments, a number of redundancy processings can be simultaneously performed, so that the time of the redundancy processing can be further shortened.

As described above, the inventions made by the present inventors has bees specifically described based on the embodiments. However, needless to say, the present invention is not limited to the above-mentioned embodiments and can be variously modified and altered without departing from the gist thereof.

What is claimed is:

1. Semiconductor testing equipment comprising:
   an algorithmic pattern generator for generating a test pattern for testing s memory under test and applying the pattern to said memory under test:
   a comparator for comparing a response signal from said memory under test with an expected value from said algorithmic pattern generator;

a fail address acquisition part for storing an address of a fail memory when a result compared by said comparator is failed;

a fail address analysis part for analyzing said failed address and calculating the address to be repaired; and a cycle-pattern generator for redundancy processing for inserting said address to be repaired into a test pattern and applying the address to said memory under test, wherein testing of said memory under test and a redundancy processing of said memory under test are executed.

2. The semiconductor testing equipment according to claim 1, wherein said algorithmic pattern generator applies, to said memory under test, a pattern for outputting information for redundancy processing stored in said memory under test;

said fail address acquisition part stores information for redundancy processing outputted from said memory under test, and said fail address analysis part reads out information for redundancy processing, which is stored in said fail address acquisition part, and makes determination of advisability of repair.

3. The semiconductor testing equipment according to claim 2, wherein said fail address analysis part makes the determination of advisability of repair by the failed address information stored in said fail address acquisition part and the information for redundancy processing stored in said fail address acquisition part, and thereby outputs the address to be repaired when the memory is repairable.

4. The semiconductor testing equipment according to claim 3, further comprising:

a monitor for displaying a test result of the advisability of repair of said memory under test.

5. The semiconductor testing equipment according to claim 2, wherein said cycle-pattern generator for redundancy processing inserts the address that is outputted from said fail address analysis part and that is to be repaired, into a cycle of the pattern for redundancy processing for performing a redundancy processing in said memory under test, and applies the inserted pattern for redundancy processing to said memory under test.

6. The semiconductor testing equipment according to claim 2,

Wherein, when a result of the testing in a wafer level is failed, the information for redundancy processing stored in said memory under test includes information of an address for repairing the failed address.

7. The semiconductor testing equipment according to claim 1, wherein said fail address acquisition part acquires in real time an address value which is failed during the testing of said memory under test.

8. The semiconductor testing equipment according to claim 1, wherein said fail address acquisition part has a fail address memory for storing the failed address, and capacity of said fail address memory is smaller than that of said memory under test.

9. A testing method for semiconductor, comprising the steps of, using the semiconductor testing equipment according to claim 1; and testing said memory under test by applying to said memory under test, a test signal outputted from said semiconductor testing equipment.

10. The testing method for semiconductor according to claim 9, further comprising the steps of:

making the determination of advisability of repair by information of an failed address acquired by testing said memory under test and the information for redundancy processing stored in said memory under test; and performing, at a time of being repairable, a redundancy processing of said memory under test by applying the address to be repaired, to said memory under test.

11. The testing method for semiconductor according to claim 10, wherein the determination of advisability of repair includes a determination of whether said failed address is smaller in number than repairable address, and a determination of whether said failed address is not the same as the repaired address in number, and the advisability of repair is judged to be repairable when said failed address is smaller in number that repairable addresses and said failed address is not the same as the repaired address.

12. A fabrication method for semiconductor, comprising the steps of:

forming a circuit element on a semiconductor wafer;

forming, over said semiconductor wafer, a wiring for electrically connecting an electrode of said circuit element and an external connection terminal;

forming a protective film over said semiconductor wafer level;

dicing said semiconductor wafer;

testing a semiconductor in a level of said semiconductor wafer;

packaging said semiconductor wafer; and testing the semiconductor in a level of said packaging;

wherein the step of testing the semiconductor in a level of said packaging performs both the memory test and the redundancy processing by using the semiconductor testing equipment according to claim 1.

13. The fabrication method for semiconductor according to claim 12, further comprising the step of:

testing again the semiconductor in the level of said packaging after the redundancy processing in performed by said semiconductor testing equipment.

14. A semiconductor memory comprising:

a memory circuit including a plurality of memory cells; and a redundancy processing circuit for replacing a defective memory cell with a redundant cell, wherein, when a test result in a level of a semiconductor wafer is failed, said redundancy processing circuit has a means for storing information on an address for performing a redundancy processing of the fail address, and the memory is constituted in such a manner that the information on the repaired address can be outputted in the level of the semiconductor wafer in accordance with a demand from the semiconductor testing equipment according to claim 1 during the testing in a packaging level.

15. The semiconductor memory according to claim 14, wherein the memory is a memory which is judged to be a nondefective at a time of the testing in the packaging level, or a memory which is judged to be repairable at a time of the testing in said packaging level and is judged again to be a nondefective in said packaging level after the redundancy processing is performed.

* * * * *